United States Patent
Tsai et al.

(10) Patent No.: US 9,230,647 B2
(45) Date of Patent: Jan. 5, 2016

(54) METAL LINE CONNECTION FOR IMPROVED RRAM RELIABILITY, SEMICONDUCTOR ARRANGEMENT COMPRISING THE SAME, AND MANUFACTURE THEREOF

(71) Applicant: Taiwan Semiconductor Manufacturing Co., Ltd., Hsin-Chu (TW)

(72) Inventors: Chun-Yang Tsai, New Taipei (TW); Yu-Wei Ting, Taipei (TW); Kuo-Ching Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 71 days.

(21) Appl. No.: 14/152,244

(22) Filed: Jan. 10, 2014

(65) Prior Publication Data

US 2015/0187418 A1    Jul. 2, 2015

Related U.S. Application Data

(60) Provisional application No. 61/921,148, filed on Dec. 27, 2013.

(51) Int. Cl.
| | | |
|---|---|---|
| *G11C 11/00* | (2006.01) | |
| *G11C 13/00* | (2006.01) | |
| *H01L 27/24* | (2006.01) | |

(52) U.S. Cl.
CPC ........ *G11C 13/0097* (2013.01); *H01L 27/2463* (2013.01)

(58) Field of Classification Search
USPC .......................................... 365/148, 163, 171
See application file for complete search history.

(56) References Cited

U.S. PATENT DOCUMENTS

| | | |
|---|---|---|
| 6,849,891 B1 | 2/2005 | Hsu et al. |
| 7,169,637 B2 | 1/2007 | Zhang et al. |
| 7,407,858 B2 | 8/2008 | Li et al. |
| 7,579,612 B2 | 8/2009 | Tang et al. |
| 7,795,606 B2 | 9/2010 | Jin et al. |
| 7,833,898 B2 | 11/2010 | Lee |
| 7,923,285 B2 | 4/2011 | Lai et al. |
| 8,009,454 B2 | 8/2011 | Lee et al. |
| 9,112,148 B2 * | 8/2015 | Chang ................ H01L 45/1253 1/1 |
| 2009/0039332 A1 | 2/2009 | Lee et al. |
| 2012/0178210 A1 | 7/2012 | Lee et al. |
| 2012/0241710 A1 | 9/2012 | Liu et al. |
| 2013/0020707 A1 * | 1/2013 | Or-Bach ................ B82Y 10/00 257/741 |
| 2013/0161707 A1 | 6/2013 | Huang et al. |

OTHER PUBLICATIONS

"International Technology Roadmap for Semiconductors"; 2007 Edition; Interconnect; p. 1-67.

* cited by examiner

*Primary Examiner* — Vu Le
(74) *Attorney, Agent, or Firm* — Eschweiler & Associates, LLC

(57) ABSTRACT

An integrated circuit device includes an array of RRAM cells, an array of bit lines for the array of RRAM cells, and an array of source lines for the array of RRAM cells. Both the source lines and the bit lines are in metal interconnect layers above the RRAM cells. The source line are thereby provided with a higher than conventional wire size, which increases the reset speed by approximately one order of magnitude. The lifetime of the RRAM transistors and the durability of the RRAM device are consequentially improved to a similar degree.

20 Claims, 8 Drawing Sheets

METAL LINE CONNECTION FOR IMPROVED RRAM RELIABILITY, SEMICONDUCTOR ARRANGEMENT COMPRISING THE SAME, AND MANUFACTURE THEREOF

PRIORITY CLAIM AND CROSS-REFERENCE

This application claims the benefit of U.S. Provisional Application No. 61/921,148, filed Dec. 27, 2013.

BACKGROUND

The present disclosure relates to integrated circuit devices with resistive random access memory, methods of making such devices, and methods of operating such devices.

Resistive random access memory (RRAM) has a simple structure, low operating voltage, high-speed, good endurance, and CMOS process compatibility. RRAM is the most promising alternative to provide a downsized replacement for traditional flash memory and is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1".

In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again. RRAM cells are typically formed after front-end-of line (FEOL) processing. In a typical design, an array of RRAM cells is formed between a pair of metal interconnect layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
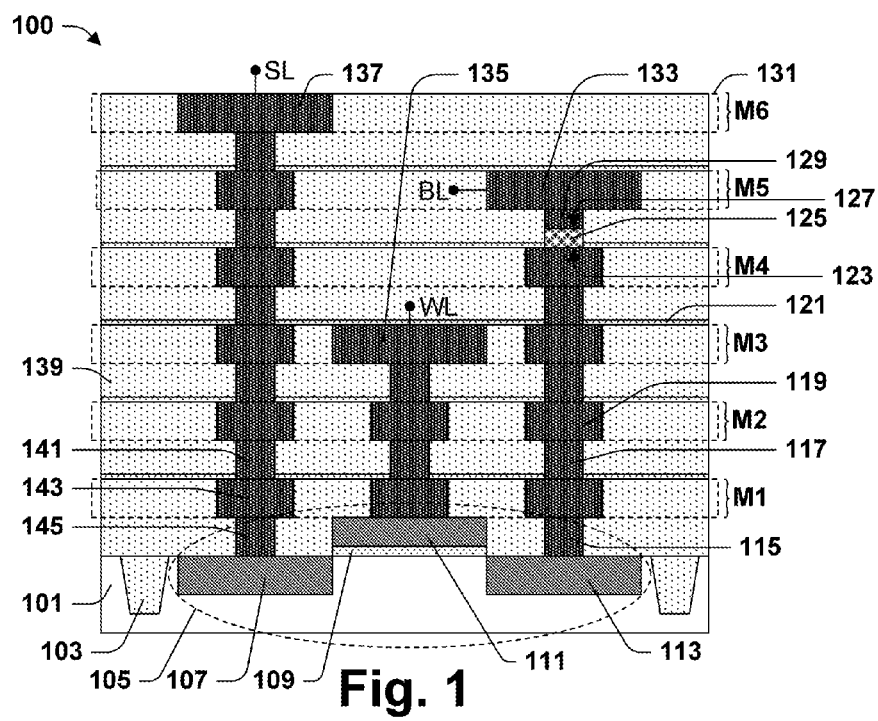
FIG. 1 illustrates an RRAM device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As densities of integrated circuits have increased, the resistance-capacitance (RC) delay of wires in metal interconnect layers has begun to have a significant effect on integrated circuit performance. Modern integrated circuits (ICs) reduce RC delay in metal interconnect layers by using copper in place of aluminum and low-k dielectrics in place of $SiO_2$. RC delay is also reduced by scaling to use thicker wires to make lengthier connections.

Scaling is done by varying wire thickness and width among metal interconnect layers. The lowest metal interconnect layers, which are closest to the substrate, have the thinnest and narrowest wires. Wires in the lowest layers have the highest RC delay and are used to make local interconnections. Wire thicknesses, widths, and separations gradually increase as additional metal interconnect layers are added. The topmost metal interconnect layers have the thickest, widest, and most coarsely spaced wires. The uppermost layers have the lowest RC delay and are used for power and clock distribution and for global signal routing.

Modern integrate circuits typically include thousands of components having complex interrelationships. Due to this complexity, the placement and routing of wires among the metal interconnect layers is usually determined by computer in a process of electronic design automation (EDA). Typically, a very large number of different circuit designs can meet a functional specification provided to an EDA program. Aside from basic design constraints, there are a variety of different performance objectives relating to such matters as performance, power, signal integrity, reliability, and yield. Because of the large number of possibilities and the computational requirements of evaluating the constraints and objective functions, the problem of specifying an optimal design is mathematically intractable. Mathematically intractable means that an optimum exists but cannot be ascertained within a feasible period of time. Accordingly, although EDA seeks optimal solutions, the search for solutions must be constrained by design rules for solutions to be reached within practical time limits.

It has been determined that the durability of an RRAM device having the 1T1R architecture, which provides one transistor for each RRAM cell, is often limited by the lifetime of the transistors. It has been further determined that the transistors age primarily during the reset operation. Due to the body effect, the reset operation requires a considerably higher voltage on the transistor gates than the set operation. It has been found that reducing the sheet resistance of the source lines provides a surprisingly large increase in the reset speed. For example, by increasing the source lines from a conventional wire size, which is the size of a wire in the second metal interconnect layer (M2), to the size of a wire in the sixth metal interconnect layer (M6), the time required for a reset operation can be reduced by approximately one order of magnitude. The lifetime of the RRAM transistors and the durability of the RRAM device can be consequentially increased by approximately one order of magnitude.

FIG. 1 provides an illustration of an integrated circuit device 100 according to some embodiments of the present disclosure. The integrated circuit device 100 includes a semiconductor substrate 101 and a plurality of metal interconnect layers 131 (M1-M6) formed over substrate 101. An RRAM cell 125 can be formed in one of these metal interconnect layers 131, between two of these layers, or in a higher layer. In most embodiments, RRAM cell 125 is formed above the fourth (M4) metal interconnect layer 131 to satisfy restrictions on the thermal budget. In some embodiments, RRAM cell 125 is formed between the fourth (M4) and fifth (M5) metal interconnect layers 131 as shown in FIG. 1.

The RRAM cell 125 is one in an array of RRAM cells 125 forming a memory block. A bit line 133 for addressing RRAM cells 125 in the memory block is formed in a metal interconnect layer 131 above RRAM cell 125. In the embodiment of FIG. 1, bit line 133 is formed in the fifth (M5) metal interconnect layer 131. In most embodiments, bit line 133 is connected to a top electrode 127 of RRAM cell 125 by a via 129.

A switching device for selecting RRAM cell 125 is formed on substrate 101. In the embodiment of FIG. 1, the switching device is transistor 105. This is representative of embodiments having a 1T1R architecture. In some embodiments, the switching device is a diode and the architecture is 1 D1R. In some embodiments, the switching device is a bipolar junction transistor and the architecture is 1 BJT1R. In some embodiments, the switching device is a bipolar switch and the architecture is 1 S1R.

In the embodiment of FIG. 1, transistor 105 is one in an array of transistors 105 separated by isolation regions 103. Transistor 105 includes a source region 107, a drain region 113, a gate 111, and a gate dielectric 109. Drain region 113 is connected to a bottom electrode 123 of RRAM cell 125 through a contact plug 115, vias 119 formed in the first through fourth (M1-M4) metal interconnect layers 131, and vias 117 formed between these metal interconnect layers 131. A word line 135 for switching the transistor 105 is formed in the third (M3) metal interconnect layer 131.

A source line 137 supplies current pulses for resetting RRAM cell 125. In device 100, source line 137 is connected to source region 107 through a contact plug 145, vias 143 formed in the first through fourth (M1-M5) metal interconnect layers 131, and vias 141 formed between these metal interconnect layers 131. By conventional design rules, source line 137 would be located in the second (M2) metal interconnect layer 131 and would have a lower cross-sectional area than bit line 133. According to some embodiments of the present disclosure, source line 137 has a cross-sectional area that is greater than or equal to the cross-sectional area of bit line 133. In most embodiments, source line 137 has a cross-sectional area that is greater than the cross-sectional area of bit line 133. In most embodiments, source line 137 is formed in a metal interconnect layer 131 above RRAM cell 125. In most embodiments, source line 137 is formed in a metal interconnect layer 131 above the metal interconnect layer 131 in which bit line 133 is formed. In the embodiment of FIG. 1, source line 137 is formed in the sixth (M6) metal interconnect layer 131.

In most embodiments, metal interconnect layers 131 are in a scaled arrangement. In a scaled arrangement the mean, mode, or maximum cross-sectional area of conductive lines within each metal interconnect layer 131 increases with increasing height above the substrate 101. Conductive line widths are generally uniform within a metal interconnect layer 131, whereby in most embodiments the mean, mode, and maximum cross-sectional areas for conductive lines within a particular metal interconnect layer 131 are all approximately equal.

In some embodiments, the mean, mode, and maximum cross-sectional areas of conductive lines of some adjacent metal interconnect layers 131 may be the same. In most embodiments, the mean, mode, or maximum cross-sectional areas of conductive lines of some metal interconnect layers 131 is greater than for other metal interconnect layers 131 and the metal interconnect layers 131 having the larger values for mean, mode, or maximum cross-sectional areas are above those for which the values are smaller. In some embodiments, conductive lines are approximately rectangular in cross-section, whereby cross-sectional area is the product of thickness and width. Thickness refers to a dimension perpendicular, or substantially perpendicular, to the substrate 101. Width refers to a dimension parallel, or substantially parallel, to the substrate 101 and is, in some embodiments, distinguished from length in that length is much greater than width for structures referred to as conductive lines. An increase in cross-sectional area can be realized through an increase in width, an increase in thickness, or an increase in both. In most embodiments, sheet resistance is approximately inversely proportional to cross-sectional area.

Figures 2A, 2B, 2C:
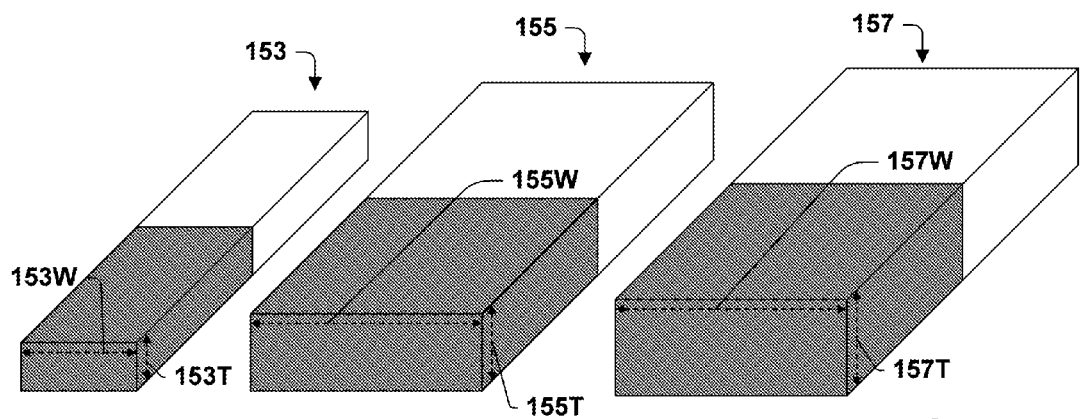
FIGS. 2A-2C illustrates some exemplary wire sizes which are suitable for the RRAM device according to some embodiments of the present disclosure.

FIG. 2A-2C illustrate conductive lines 153, 155, and 157 according to some embodiments of the present disclosure. Conductive lines 153, 155 and 156 have widths 153W, 155W, and 157W and thicknesses 153T, 155T, and 157T, respectively. In some embodiments, conductive line 153 is formed in the second (M2) metal interconnect layer 131. An EDA program of the prior art would be expected to place source lines in M2. In some embodiments, conductive line 153 is formed in the third (M3) metal interconnect layer 131. In some embodiments, conductive line 153 is word line (WL) 135. In some embodiments, conductive line 155 is formed in the fifth (M5) metal interconnect layer 131. In some embodiments, conductive line 155 is bit line (BL) 133. In some embodiments, conductive line 157 is formed in the sixth (M6) metal interconnect layer 131. In some embodiments, conductive line 157 is source line (SL) 137. The following table provides ranges for the relative dimensions and cross-sectional areas of these conductive lines according to some embodiments of the present disclosure:

| Levels Compared | Lines Compared | Dimension Compared | Ratio Range |
|---|---|---|---|
| M5 to M2 | BL to WL | Thickness | 1.4 to 2.5 |
| M5 to M2 | BL to WL | Width | 1.5 to 3.0 |
| M5 to M2 | BL to WL | Cross-sectional area | 2.0 to 6.0 |
| M6 to M5 | SL to BL | Thickness | 1.1 to 1.4 |
| M6 to M5 | SL to BL | Width | 1.0 to 1.3 |
| M6 to M5 | SL to BL | Cross-sectional area | 1.1 to 1.8 |
| M6 to M2 | SL to WL | Thickness | 1.5 to 3.0 |
| M6 to M2 | SL to WL | Width | 1.5 to 4.0 |
| M6 to M2 | SL to WL | Cross-sectional area | 2.2 to 10.0 |

Placement of source line 137 above the fourth (M4) metal interconnect layer 131, in accordance with some embodiments of the present disclosure, increases its cross-sectional area and reduces its sheet resistance by a factor of two or more in comparison to the cross-sectional area and sheet resistance if source line 137 where configured or positioned according to conventional design rules. In some embodiments, the cross-sectional area of source line 137 is equal to that of bit line 133. In most embodiments, the cross-sectional area of source line 137 is greater than that of bit line 133. In some embodiments, bit line 133 and RRAM cell 125 are located or formed in layers located between the metal interconnect layers 131 containing source line 133 and word line 135. In most embodiments, word line 135 is located below bit line 133 and RRAM cell 125.

Figure 3:
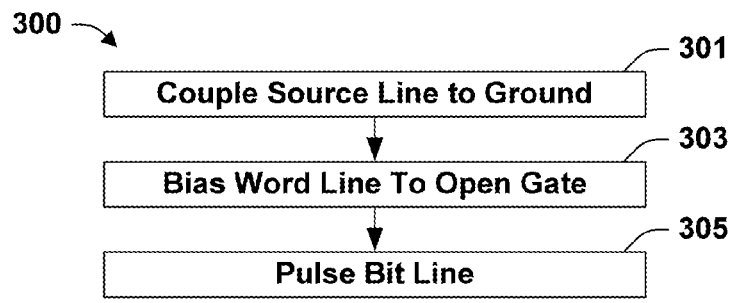
FIG. 3 is a flow chart illustrating a method of setting an RRAM cell according to some embodiments of the present disclosure.
Figure 4:
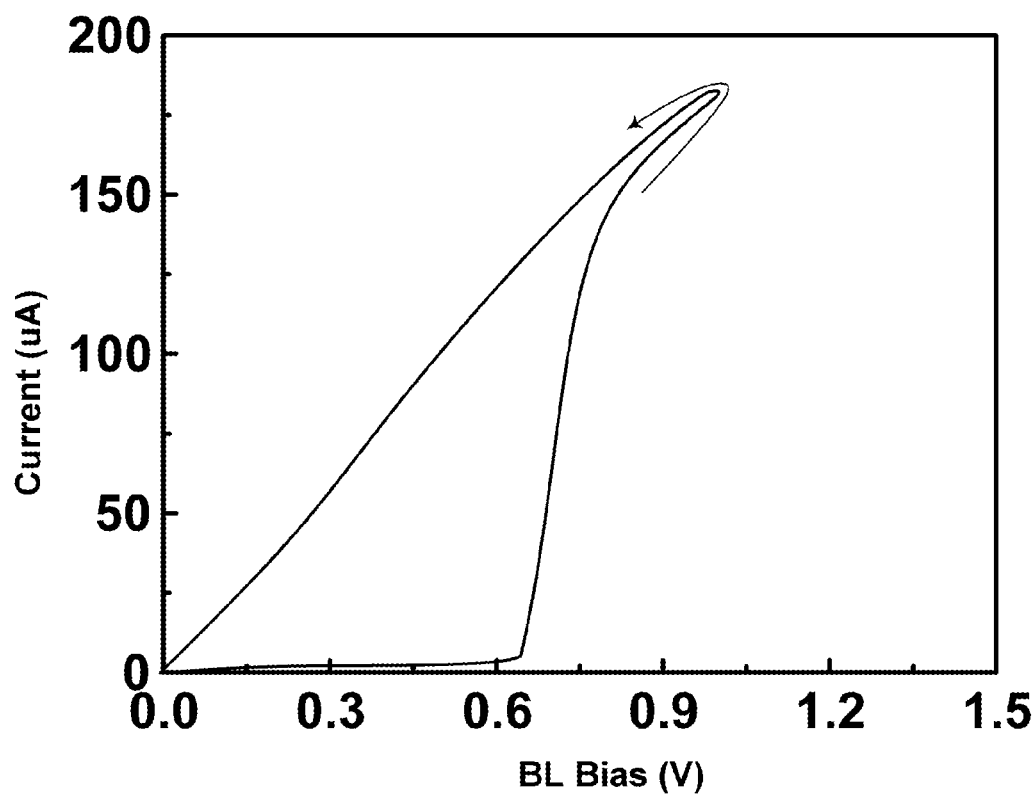
FIG. 4 is a plot showing voltages across and currents through an RRAM cell as it undergoes a RRAM cell setting process according to some embodiments of the present disclosure.

Bit line 133, word line 135, and source line 137 are used to set and reset RRAM cell 125. FIG. 3 provides an example of a process 300 for setting RRAM cell 125. The process 300 includes act 301, setting source line 137 to a reference voltage, which is typically ground, act 303, setting word line 135 to a bias sufficient to turn on transistor 105, and act 305, pulsing bit line 133 to provide a voltage-current cycle as shown in FIG. 4. In most embodiments, a bias of 1.4 V is sufficient to turn on transistor 105 for the set operation 300.

Figure 5:
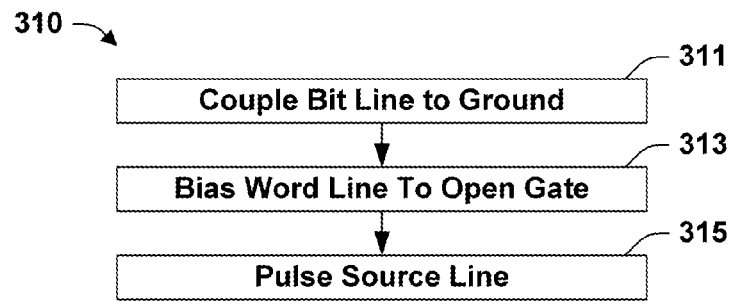
FIG. 5 is a flow chart illustrating a method of resetting an RRAM cell according to some embodiments of the present disclosure.
Figure 6:
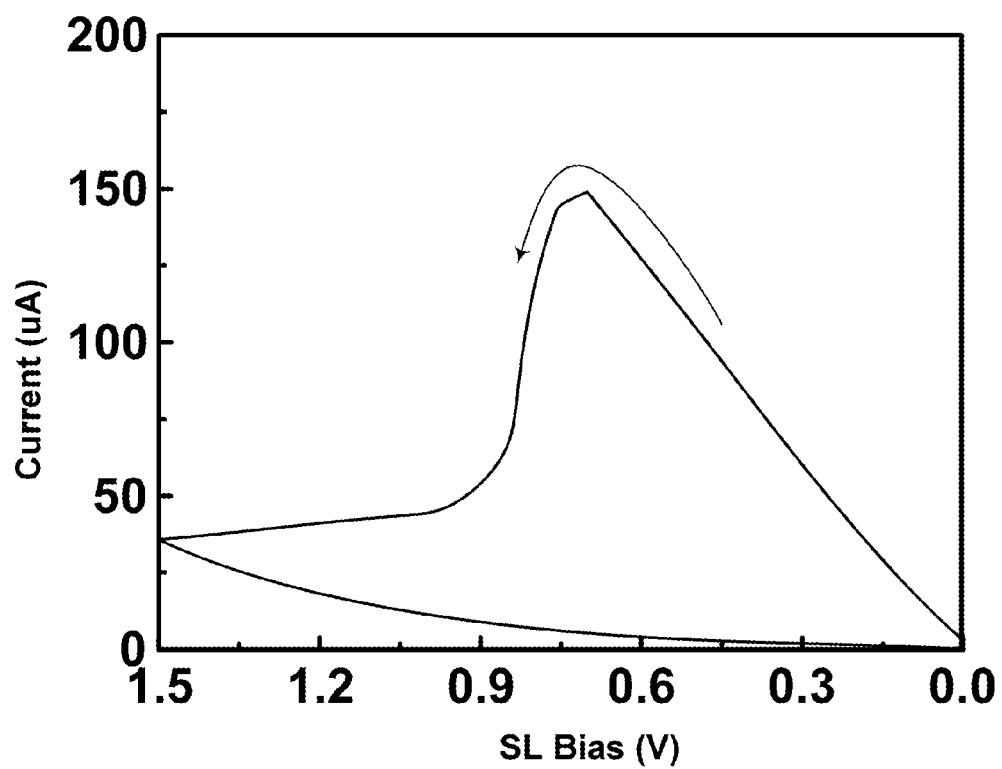
FIG. 6 is a plot showing voltages across and currents through an RRAM cell as it undergoes an RRAM cell resetting process according to some embodiments of the present disclosure.

FIG. 5 provides an example of a process 310 for resetting RRAM cell 125. The process 310 includes act 311, setting bit line 133 to a reference voltage, which is typically ground, act 313, setting word line 135 to a bias sufficient to turn on transistor 105, and act 315, pulsing source line 137 to provide a voltage-current cycle as shown in FIG. 6. In most embodiments, a bias over 2 V, e.g., 2.4 V, is required to turn on transistor 105 for the reset operation 310. As shown by FIGS. 4 and 6, reset operation 310 requires a higher amplitude pulse than set operation 300. The voltages shown are voltages across the cell 125. Acts 303 and 313 pulse bit line 133 or source line 137 with somewhat higher voltages to overcome the parasitic resistances of these lines. Providing source line 137 with a lower sheet resistance than bit line 133 makes the pulse requirements of set and reset operations more nearly equal.

Figure 7:
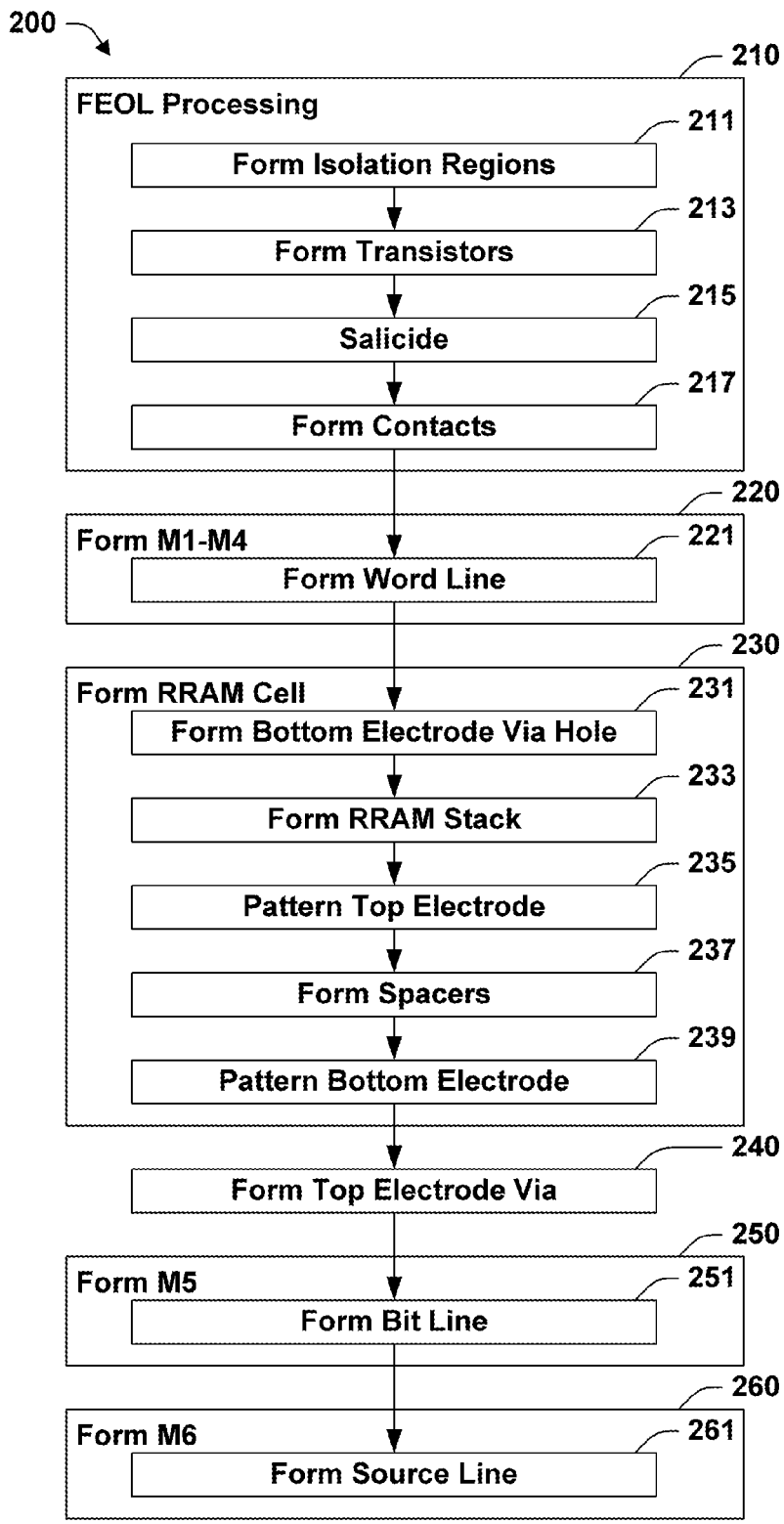
FIG. 7 is a flow chart illustrating an RRAM device manufacturing method according to some embodiments of the present disclosure.

FIG. 7 provide a flow chart for a process 200 of forming an RRAM cell 125, which is an example according to another embodiment of the present disclosure. The process 200 can form the RRAM device 100 according to some embodiments of the present disclosure. FIGS. 8-10 and 16-17 illustrate the RRAM device 100 at intermediate stages of manufacture thereof according to some embodiments of the present disclosure. FIGS. 11-15 illustrate cross-sectional views at various stages of forming an RRAM cell 125 and the structure within the area 126 identified in FIG. 16 according to some embodiments of the present disclosure.

Figure 8:
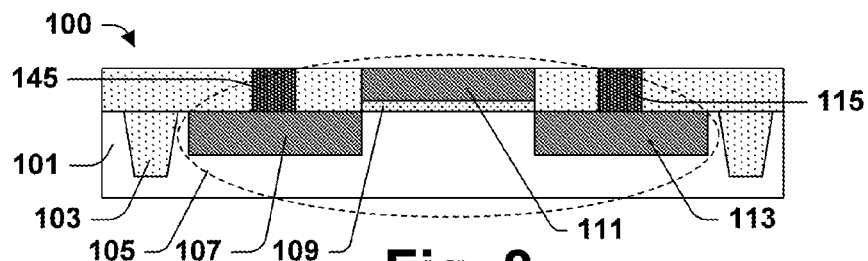
FIGS. 8-10 illustrate cross-sectional views at various intermediate stages of manufacturing an RRAM device according to some embodiments of the present disclosure.

Process 200 begins with front-end-of-line (FEOL) processing 210. FEOL processing 210 can include acts that form a switching device for selecting RRAM cell 125. In the example of FIG. 7, FEOL processing 210 includes act 211, forming isolation regions 103 in substrate 101, act 213, forming transistor 105 on substrate 101, act 215, saliciding source region 107 and drain region 113 of transistor 105, and act 217, forming source contact 145 and drain contact 115. FIG. 8 illustrates the device 100 immediately following FEOL processing 210.

Figure 9:
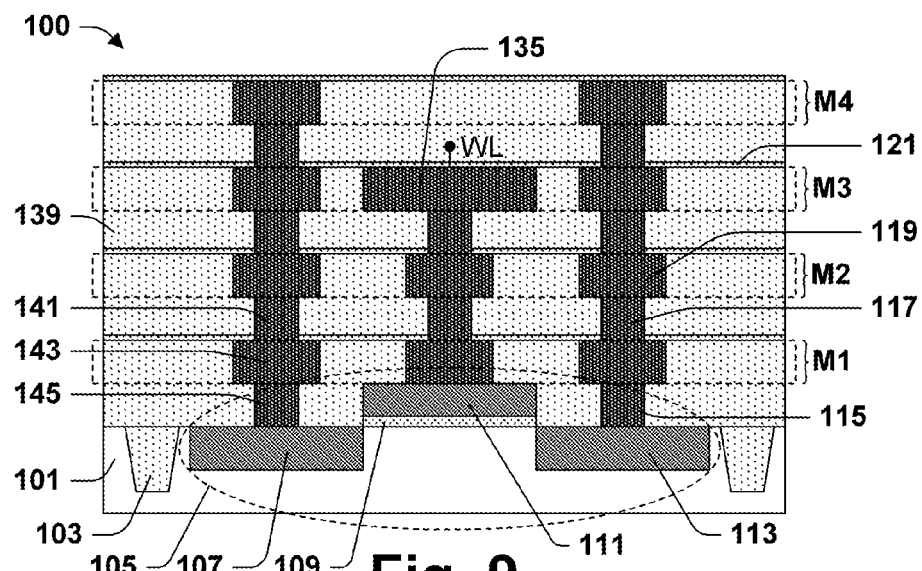

Process 200 continues with act 220, forming the first through fourth (M1-M4) metal interconnect layers 131 as shown in FIG. 9 for the device 100. Act 220 includes act 221, forming word line 135. In most embodiments, word line 135 is formed in one of the first (M1) through third (M3) metal interconnect layers 131. In some embodiments, word line 135 is formed in the third (M3) metal interconnect layer 131 as shown in FIG. 9.

Metal interconnect layers 131 include conductive lines and vias in matrices of dielectric 139. The conductive lines and vias can be formed from any conductive material. In some embodiments, the conductive material is copper for all of the metal interconnect layer 131 above the first (M1). The dielectric 139 can be any suitable dielectric and can include multiple layers of different dielectrics. In most embodiments, the dielectric 139 is a low-k dielectric. In some embodiments, the dielectric 139 is an extremely low-k dielectric. An extremely low-k dielectric is a material having a dielectric constant of about 2.1 or less. An extremely low-k dielectric is generally formed by a low dielectric material with 20% or more voids (pores or air gaps). In most embodiments, a dielectric etch stop layer 121 is formed over each of the first (M1) through fourth (M4) metal interconnect layers 131. In most embodiments, metal interconnect layers 131 are formed by damascene or dual damascene processes.

Figure 10:
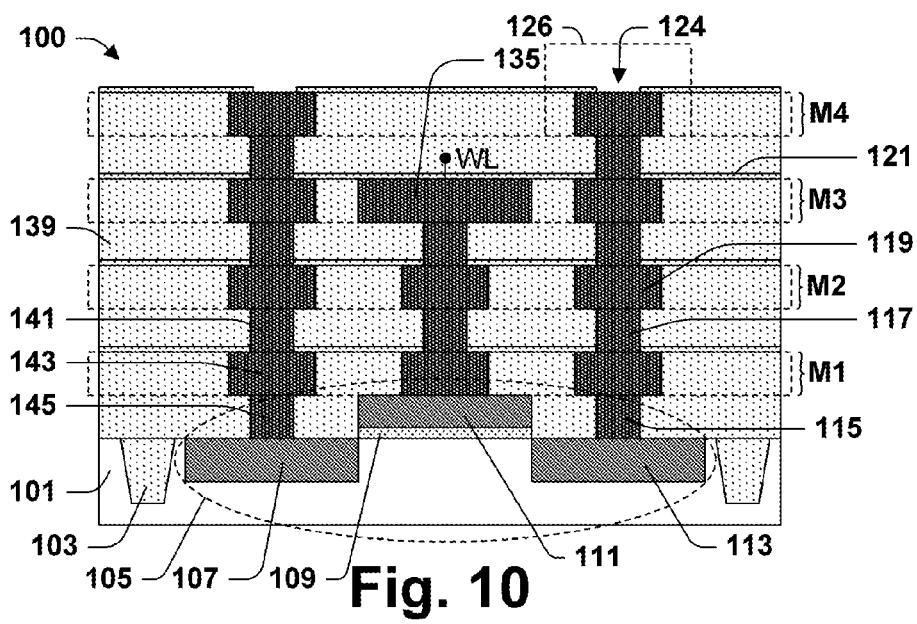
Figure 11:
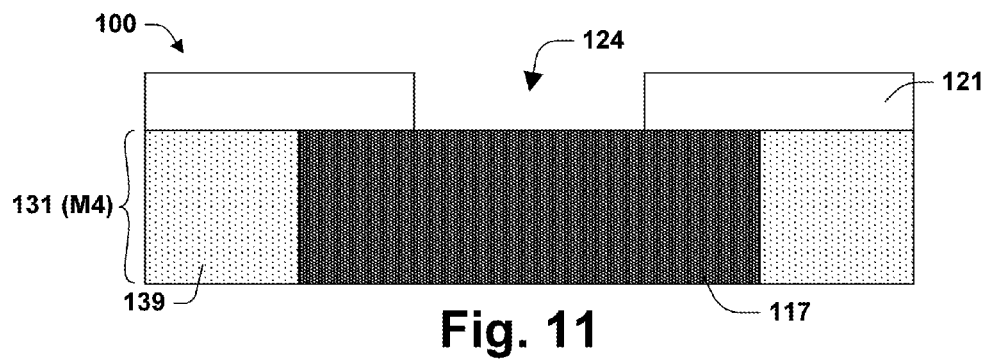
FIGS. 11-15 illustrate cross-sectional views at various intermediate stages of manufacturing an RRAM cell according to some embodiments of the present disclosure.

Process 200 continues with a series of acts 230 that form RRAM cell 125. The first of these acts is forming a hole 124 through which RRAM cell 125 can form a contact with a via 119 in the underlying metal interconnect layer 131 as shown in FIGS. 10 and 11. The hole 124 can be formed through dielectric 139, or through just etch stop layer 121 as shown in the figures.

Figure 12:
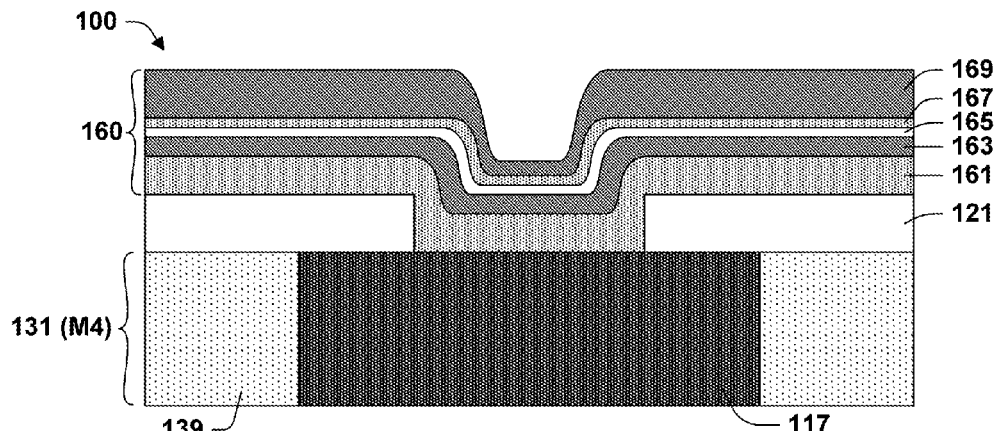

The series of acts 230 continues with act 233, forming an RRAM stack 160 from which RRAM cell 125 is formed. In some embodiments, hole 124 is filled with conductive material to make a bottom electrode via prior to act 233. In other embodiments, RRAM stack 160 is formed over hole 124 and fills hole 124 as shown in FIG. 12. In most embodiments, RRAM stack 160 includes a diffusion barrier layer 161, a bottom electrode layer 163, an RRAM dielectric layer 165, a capping layer 167, and a top electrode layer 169 as shown in FIG. 12. The order of these layers is for the case where bit line 133 is coupled to top electrode layer 169. Where a capping layer 167 is included, the bit line can be identified as the addressing line coupled on the same side of RRAM dielectric layer 165 as capping layer 167.

Diffusion barrier layer 161 is an optional layer. It can be included to prevent contamination of bottom electrode layer 163 by material from a bottom contact such as a via 119. In some embodiments for which diffusion barrier layer 161 is included, the bottom contact is copper and bottom electrode 163 is a material susceptible to contamination by copper. In some of these embodiments, bottom electrode layer 163 is TiN. Diffusion barrier layer 161 can have any suitable composition and can be formed by any suitable process. In most embodiments, diffusion barrier layer 161 is a conductive oxide, nitride, or oxynitride of a metal selected from the group consisting of Al, Mn, Co, Ti, Ta, W, Ni, Sn, Mg. In some embodiments, diffusion barrier layer 161 is TaN. Diffusion barrier layer 161 can have any suitable thickness. A suitable thickness is large enough to provide an effective diffusion barrier while not being so large as to cause excessive resistance. In most embodiments, the thickness of diffusion barrier layer 161 is in the range from 20 Å to 300 Å. In some embodiments, the thickness of diffusion barrier layer 161 is in the range from 100 Å to 300 Å, for example, 200 Å.

Bottom electrode layer 163 can have any suitable composition and can be formed by any suitable process. Examples of suitable compositions include, without limitation, metals, metal nitrides, and doped polysilicon. In some embodiments, bottom electrode layer 163 is a metal. The metal could be, for example, Al, Ti, Ta, Au, Pt, W, Ni, Ir, or Cu. In some embodiments, bottom electrode layer 163 is a metal nitride. The metal nitride could be, for example, TaN. In some embodiments, bottom electrode layer 163 is a doped polysilicon. A doped polysilicon can be either a p+ doped polysilicon or an n+ doped polysilicon. In most embodiments, the thickness of bottom electrode layer 163 is in the range from 20 Å to 200 Å. In some embodiments, the thickness of bottom electrode layer 163 is in the range from 50 Å to 150 Å, for example, 100 Å.

RRAM dielectric 165 can be any material suitable for the data storage layer of an RRAM cell. A material suitable for the data storage layer of an RRAM cell is one that can be induced to undergo a reversible phase change between a high resistance state and a low resistance state. In some embodiments, the phase change is between an amorphous state and a metallic state. The phase change can be accompanied by or associated with a change in chemical composition. For example, an amorphous metal oxide may lose oxygen as it undergoes a phase change to a metallic state. The oxygen may be stored in a portion of RRAM dielectric 165 that remains in the amorphous state or in an adjacent layer. Although described as a dielectric, only the low resistance state need be a dielectric. In most embodiments, RRAM dielectric 165 is a high-k dielectric while in the low resistance state. In some embodiments, the RRAM dielectric 165 is a transitional metal oxide. Examples of materials that can be suitable for RRAM dielectric 165 include $NiO_x$, $Ta_xO_x$, $TiO_x$, $HfO_x$, $Ta_yO_x$, $WO_x$, $ZrO_x$, $Al_yO_x$, and $SrTiO_x$. In most embodiments, the thickness of RRAM dielectric 165 is in the range from 20 Å to 100 Å. In some embodiments, the thickness of RRAM dielectric 165 is in the range from 30 Å to 70 Å, for example, 50 Å.

Capping layer 167 is optional. In some embodiments, capping layer 167 provides an oxygen storage function that facilitates phase changes within the RRAM dielectric 165. In some embodiments, capping layer 167 is a metal or a metal oxide that is relatively low in oxygen concentration. Examples of metals that can be suitable for capping layer 167 include Ti, Hf, Pt and Al. Examples of metal oxides that can be suitable for capping layer 167 include $TiO_x$, $HfO_x$, $ZrO_x$, $GeO_x$, $CeO_x$. Capping layer 167 can have any suitable thickness. In most embodiments, the thickness of capping layer 167 is in the range from 20 Å to 100 Å. In some embodiments, the thickness of capping layer 167 is in the range from 30 Å to 70 Å, for example, 50 Å. Where capping layer 167 is provided, it is on the same side of RRAM dielectric 165 as the side to which bit line 133 is connected.

Top electrode layer 169 can have any of the compositions identified as suitable for bottom electrode layer 163. Top electrode layer 169 can have any suitable thickness. In most embodiments, top electrode layer 169 has a thickness in the range from 100 Å to 400 Å. In typical embodiments, top electrode layer 169 has a thickness in the range from 150 Å to 300 Å, for example 250 Å.

Figure 13:
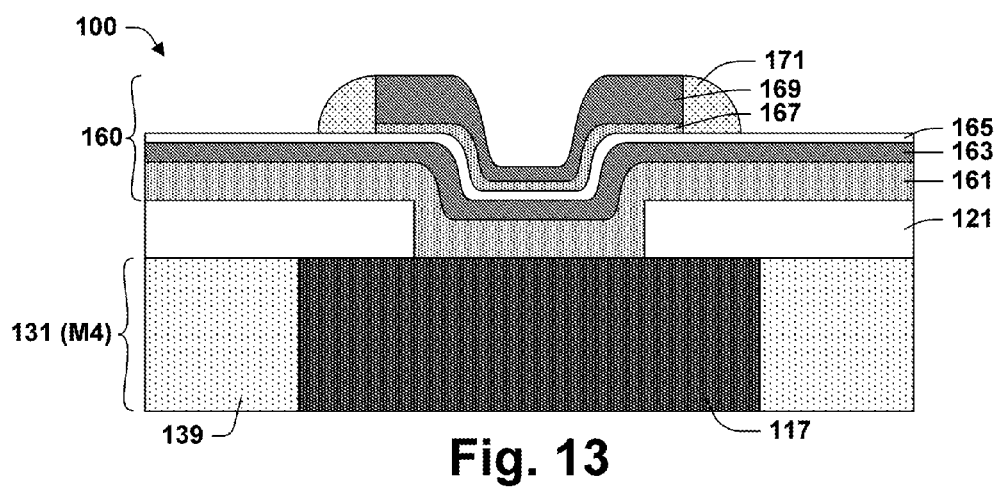

The series of acts 230 that form RRAM cell 125 can continue with act 235, patterning top electrode layer 169 and act 237, forming spacers 171 as shown in FIG. 13. In most embodiments, act 235, patterning top electrode layer 169 includes an etch that continues through capping layer 167. In most embodiments, RRAM dielectric 165 provides an etch stop for patterning top electrode 169. Act 237, forming spacers 171, includes depositing a layer of spacer material and etching to form spacers 171. Spacer 171 can be formed of any suitable spacer material. Examples of materials suitable for spacers 171 include, without limitation, SiN, SiON and $SiO_2$.

Figure 14:
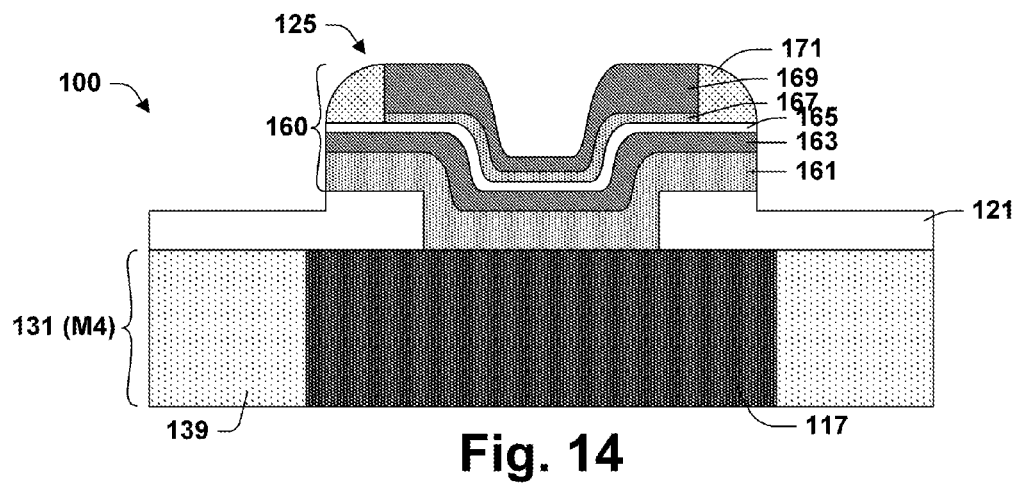

The series of acts 230 continues with act 239, which is patterning bottom electrode layer 163 to form a structure as shown in FIG. 14. As shown in FIG. 14, patterning bottom electrode layer 163 can include patterning capping layer 161.

Figure 15:
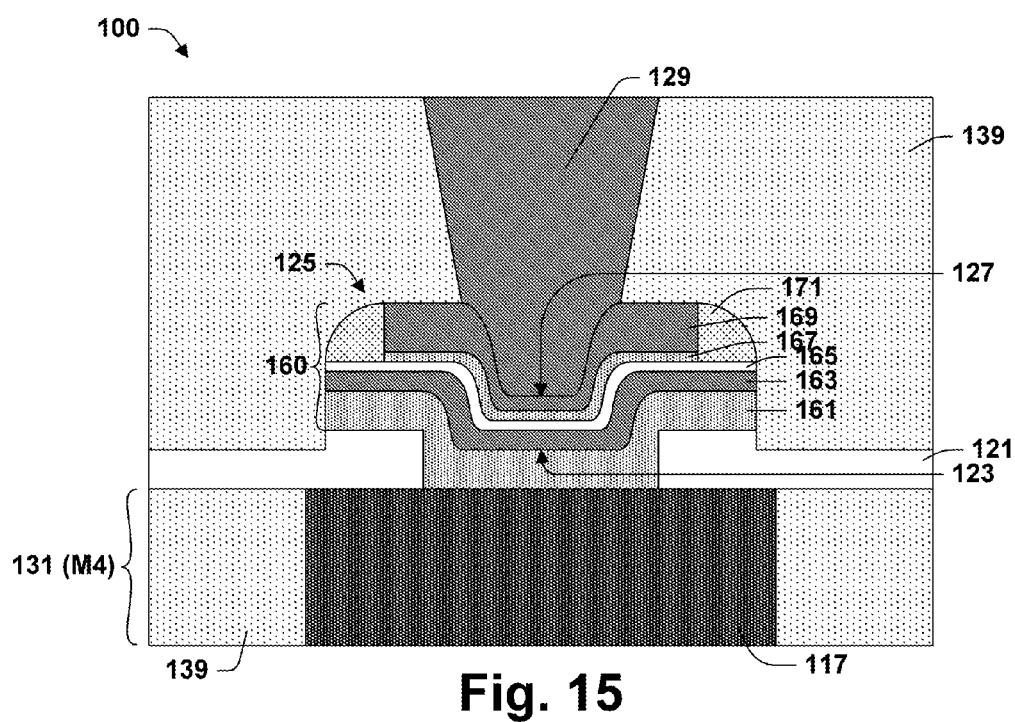
Figure 16:
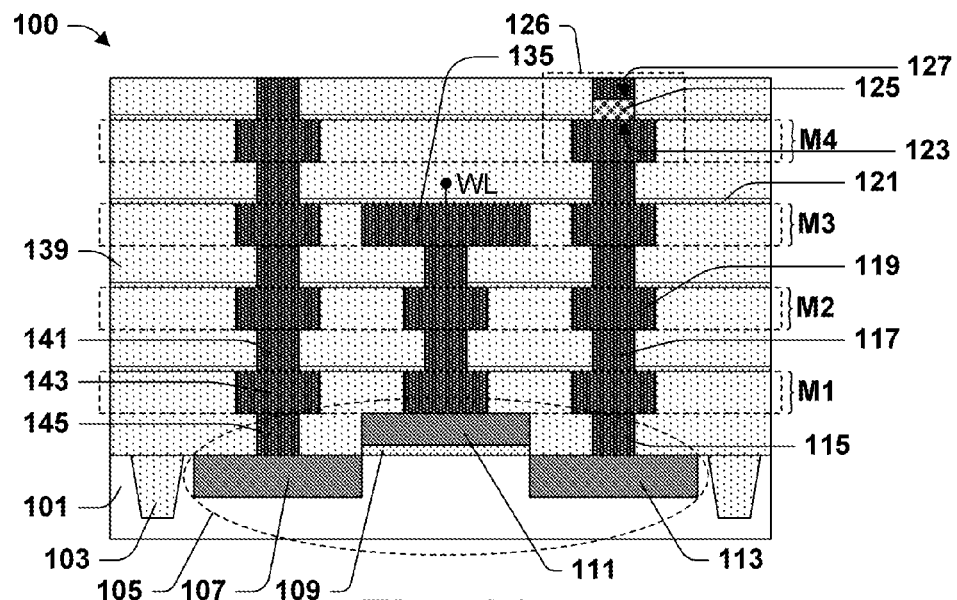
FIGS. 16-17 illustrate cross-sectional views at various intermediate stages of manufacturing an RRAM device according to some other embodiments of the present invention.

Process 200 continues with act 240, forming top electrode via 129 to form a structure as shown in FIGS. 15 and 16. In most embodiments, forming top electrode via 129 includes forming a layer of dielectric 139, patterning a hole through the dielectric layer 139 for top electrode via 129, and filling the hole with metal to form top electrode via 129 as shown in FIGS. 15 and 16.

Figure 17:
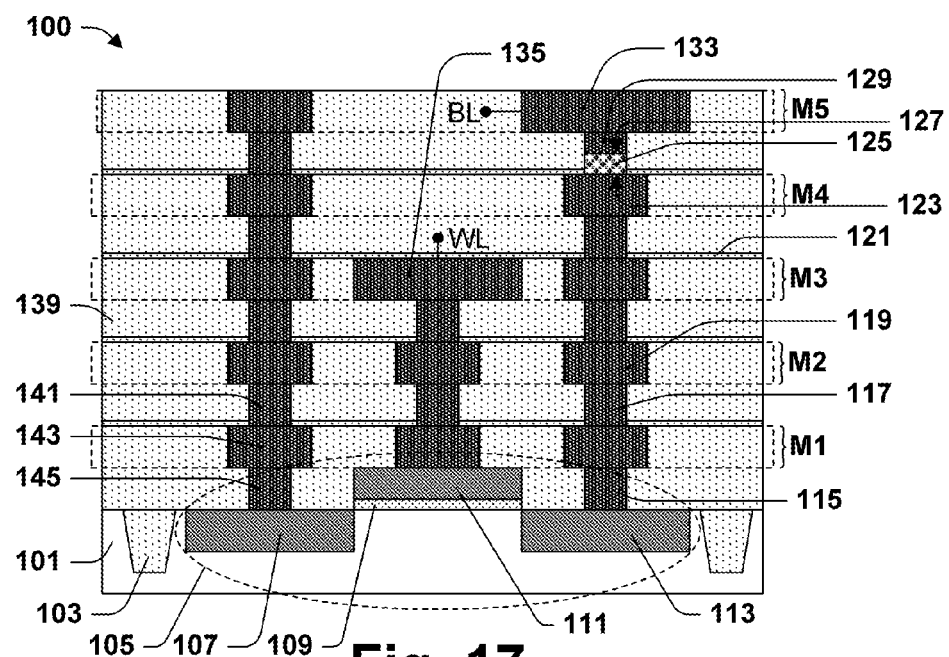

Process 200 continues with act 250, forming the fifth (M5) metal interconnect layer 131 to form a structure as shown in FIG. 17. In this example, forming the fifth (M5) metal interconnect layer 131 includes act 251, forming bit line 133. The sequence of process 200 places bit line 133 above RRAM cell 125.

Process 200 continues with act 250, forming the sixth (M6) metal interconnect layer 131 to form a structure as shown in FIG. 1. In this example, forming the sixth (M6) metal interconnect layer 131 includes act 261, forming source line 137. The sequence of process 200 places source line 137 above RRAM cell 125 and above bit line 133. With conventional scaling of metal interconnect layers 131, this makes the cross-sectional area of source line 137 greater than the cross-sectional area of bit line 133 and greater than the cross-sectional area of a source line formed before RRAM cell 125.

One embodiment of the present disclosure is an integrated circuit device that includes an array of RRAM cells, an array of bit lines connected to the RRAM cells of the array, and an array of source lines for the RRAM cells of the array. The source lines and the bit lines are configured to carry current for setting and resetting the RRAM cells. The source lines have a larger cross-sectional area than the bit lines.

Another embodiment of the present disclosure is an integrated circuit device that includes a semiconductor substrate, a plurality of metal interconnect layers formed over the semiconductor substrate, an RRAM cell located between two of the metal interconnect layers, a bit line coupled to the RRAM cell, and a source line configured to be selectively coupled to the RRAM cell. Both the source line and the bit line are located in metal interconnect layers higher above the semiconductor substrate than the RRAM cell.

Another embodiment of the present disclosure is a method of resetting an RRAM cell. The method includes coupling a top electrode of the RRAM cell to a bit line, coupling the bottom electrode of the RRAM cell to a source line having a lower sheet resistance than the bit line, and driving the voltage of the source line to send a current pulse through the RRAM cell. The current pulse resets the RRAM cell.

Another embodiment of the present disclosure is a method of operating an integrated circuit device having an RRAM cell. The RRAM cell has a top electrode and a bottom electrode and a high resistance state and a low resistance state. The method includes setting the RRAM cell to the high resistance state and resetting the RRAM cell to the low resistance state. Resetting the RRAM cell to the low resistance state includes connecting the bottom electrode of the RRAM cell to a source potential through a source line while the top electrode of the RRAM cell is connected to reference potential through a bit line. The source line has a greater cross-sectional area than the bit line.

Another embodiment of the present disclosure is a method of manufacturing an integrated circuit device. The method includes putting a semiconductor substrate through front-end-of-line processing, forming a first set of metal interconnect layers over the substrate, forming an RRAM cell over the first set of metal interconnect layers, and forming a second set of metal interconnect layers over the first set of inter-connect layers and the RRAM cell. Forming the second set of metal interconnect layers includes forming a bit line and a source line for setting and resetting the RRAM cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
    an array of RRAM cells;
    an array of bit lines connected to the RRAM cells of the array, each of the bit lines having a first cross-sectional area; and
    an array of source lines for the RRAM cells of the array, each of the source lines having a second cross-sectional area;
    wherein the second cross-sectional area is greater than the first cross-sectional area; and
    the source lines and bit lines are configured to carry current for setting and resetting the RRAM cells.

2. The integrated circuit device of claim 1 further comprising:
    an array of transistors in one-to-one correspondence with the RRAM cells, the transistors comprising source regions, drain regions, and gate electrodes;
    wherein the source regions are connected to the source lines; and
    the drain regions are connected to the RRAM cells.

3. The integrated circuit device of claim 2, further comprising:
    an array of word lines configured for addressing the RRAM cells;
    wherein the word lines are connected to the gate electrodes.

4. The integrated circuit device of claim 3, further comprising:
    a substrate;
    a plurality of metal interconnect layers at various heights above the substrate;
    wherein the array of RRAM cells is located between two of the metal interconnect layers;
    the source lines are located in a metal interconnect layer that is higher above the substrate than the array of RRAM cells;
    the bit lines are located in a metal interconnect layer that is higher above the substrate than the array of RRAM cells; and
    the word lines are located in a metal interconnect layer that is not as high above the substrate as the array of RRAM cells.

5. The integrated circuit device of claim 1, further comprising:
    a substrate;
    a plurality of metal interconnect layers at various heights above the substrate;
    wherein the array of RRAM cells is located between two of the metal interconnect layers; and
    the source lines are located in a metal interconnect layer that is higher above the substrate than the array of RRAM cells.

6. The integrated circuit device of claim 5, wherein:
    the bit lines are connected to top electrodes of the RRAM cells; and
    the bit lines are located in a metal interconnect layer that is higher above the substrate than the array of RRAM cells.

7. The integrated circuit device of claim 6, wherein:
    the source lines are located in a metal interconnect layer that is higher above the metal interconnect layer in which the bit lines are formed.

8. The integrated circuit device of claim 7, wherein at least two metal interconnect layers are formed below the array of RRAM cells.

9. The integrated circuit device of claim 8, further comprising:
    an array of transistors formed on the substrate below the metal interconnect layers, the transistors comprising source regions, drain regions, and gate electrodes;
    wherein source regions of the transistors are connected to the source lines; and
    the drain regions of the transistors are connected to bottom electrodes of the RRAM cells.

10. The integrated circuit device of claim 9, wherein at least four metal interconnect layers are formed below the array of RRAM cells.

11. The integrated circuit device of claim 1, further comprising:
    a substrate having a substrate surface; and
    a plurality of metal interconnect layers above the substrate surface;
    wherein the array of RRAM cells is located between two of the metal interconnect layers;
    the RRAM cells comprise top electrodes, bottom electrodes, and RRAM dielectric layers between the top and bottom electrodes;
    the bit lines are connected to the top electrodes;
    the bottom electrodes are connected to first contacts on the substrate surface; and
    the source lines are connected to second contacts on the substrate surface.

12. The integrated circuit device of claim 11, wherein the source lines are located in a metal interconnect layer that is higher above the substrate surface than the array of RRAM cells.

13. The integrated circuit device of claim 11, wherein the source lines are located in a metal interconnect layer that is higher above the substrate surface than the bit lines.

14. An integrated circuit (IC) device comprising:
- an array of RRAM cells disposed above a substrate, wherein the array of RRAM cells is located between first and second metal interconnect layers arranged over the substrate;
- a plurality of bit lines connected to the RRAM cells of the array, each of the plurality of bit lines having a first cross-sectional area;
- a plurality of source lines operatively coupled to the RRAM cells of the array, each of the plurality of source lines having a second cross-sectional area, wherein the second cross-sectional area is greater than the first cross-sectional area; and
- wherein the source lines are located in a third metal interconnect layer that is higher above the substrate than the array of RRAM cells.

15. The IC device of claim 14, wherein the plurality of source lines and the plurality of bit lines are configured to carry current for setting and resetting the RRAM cells.

16. The IC device of claim 15, wherein:
- the bit lines are connected to top electrodes of the RRAM cells; and
- the bit lines are located in a fourth metal interconnect layer that is higher above the substrate than the array of RRAM cells.

17. The IC device of claim 16, wherein the third metal interconnect layer is higher above the substrate than the fourth metal interconnect layer.

18. The IC device of claim 17, wherein at least two metal interconnect layers are located below the array of RRAM cells.

19. The IC device of claim 18, further comprising:
- an array of transistors arranged in the substrate below the metal interconnect layers, the transistors comprising source regions, drain regions, and gate electrodes;
- wherein source regions of the transistors are connected to the source lines; and
- the drain regions of the transistors are connected to bottom electrodes of the RRAM cells.

20. An integrated circuit (IC) device comprising:
- a plurality of metal interconnect layers above a substrate;
- a RRAM cell disposed above the substrate between two of the plurality of metal interconnect layers, wherein the RRAM cell comprises a top electrode, a bottom electrode, and an RRAM dielectric layer located between the top electrode and the bottom electrode;
- a bit line connected to the top electrode of the RRAM cell, wherein the bit line has a first cross-sectional area;
- a source line located in a metal interconnect layer that is higher above the substrate than the bit line and having a second cross-sectional area greater than the first cross-sectional area; and
- a transistor device arranged within the substrate and having a first terminal connected to the bottom electrode of the RRAM cell and a second terminal connected to the source line.

* * * * *